(12) United States Patent
Das et al.

(10) Patent No.: US 6,933,744 B2
(45) Date of Patent: Aug. 23, 2005

(54) LOW-LEAKAGE INTEGRATED CIRCUITS AND DYNAMIC LOGIC CIRCUITS

(75) Inventors: Koushik K. Das, Ann Arbor, MI (US); Richard B. Brown, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 6 days.

(21) Appl. No.: 10/458,044

(22) Filed: Jun. 10, 2003

(65) Prior Publication Data

US 2004/0021501 A1 Feb. 5, 2004

Related U.S. Application Data

(60) Provisional application No. 60/387,822, filed on Jun. 11, 2002.

(51) Int. Cl.[7] ............................................. H03K 19/01
(52) U.S. Cl. ............................. 326/17; 326/95; 326/34
(58) Field of Search .............................. 326/95–98, 17, 326/34

(56) References Cited

U.S. PATENT DOCUMENTS

| | | | |
|---|---|---|---|
| 5,559,368 A | | 9/1996 | Hu et al. |
| 5,821,769 A | | 10/1998 | Douseki |
| 5,831,451 A | | 11/1998 | Bosshart |
| 5,917,365 A | * | 6/1999 | Houston .................... 327/534 |
| 6,040,610 A | | 3/2000 | Noguchi et al. |
| 6,087,893 A | | 7/2000 | Oowaki et al. |
| 6,097,241 A | | 8/2000 | Bertin et al. |
| 6,111,427 A | | 8/2000 | Fujii et al. |
| 6,118,328 A | * | 9/2000 | Morikawa .................. 327/534 |
| 6,166,584 A | | 12/2000 | De |
| 6,213,869 B1 | | 4/2001 | Yu et al. |
| 6,218,895 B1 | | 4/2001 | De et al. |
| 6,225,846 B1 | | 5/2001 | Wada et al. |
| 6,232,827 B1 | | 5/2001 | De et al. |
| 6,271,713 B1 | | 8/2001 | Krishnamurthy |
| 6,300,819 B1 | | 10/2001 | De et al. |
| 6,337,593 B1 | | 1/2002 | Mizuno et al. |
| 6,345,362 B1 | | 2/2002 | Bertin et al. |
| 6,600,340 B2 | * | 7/2003 | Krishnamurthy et al. ..... 326/98 |

OTHER PUBLICATIONS

Shin'Ichiro Mutoh et al., 1–V Power Supply High–Speed Digital Circuit Technology with Multithreshold–Voltage CMOS; IEEE Journal of Solid–State Circuits, vol. 30, No. 8, Aug. 1995.

(Continued)

*Primary Examiner*—Anh Q. Tran
(74) *Attorney, Agent, or Firm*—Rader, Fishman & Grauer PLLC (57) ABSTRACT

An integrated circuit is disclosed that includes one or more blocks of switching logic (comprised of transistors) connected between a power supply and a common node. A control transistor connects the common node to ground. The control transistor has a higher threshold voltage level than the voltage threshold level(s) of the transistors that comprise the switching logic blocks. A bias generator provides a positive bias to the body of the control transistor when the control transistor is "on."

Further disclosed is an integrated circuit comprising a first plurality of serially connected transistors establishing a first current path from a voltage source to ground and a second plurality of serially connected transistors establishing a second current path from the voltage source to ground. The first and second plurality of transistors each includes at least one high-threshold transistor. The integrated circuit further includes a means for decreasing a resistance level of the high threshold transistors when the high threshold transistors are on.

27 Claims, 6 Drawing Sheets

OTHER PUBLICATIONS

Tadahiro Kuroda et al., A 0.9–V, 150–MHz, 10–mW, 4mm² 2–D Discrete Cosine Transform Core Processor with Variable Threshold–Voltage (VT) Scheme; IEEE Journal of Solid–State Circuits, vol. 31, No. 11, Nov. 1996.

Hiroshi Kawaguchi et al., A Super Cut–Off CMOS (SCC-MOS) Scheme for 0.5–V Supply Voltage with Picoampere Stand–By Current; IEEE Journal of Solid–State Circuits, vol. 35, No. 10, Oct. 2000.

Mario R. Casu et al., Synthesis of Low–Leakage PD–SOI Circuits with Body–Biasing; ISLPED Aug. 2001.

James T. Kao et al, Dual–Threshold Voltage Techniques for Low–Power Digital Circuits; IEEE Journal of Solid–State Circuits, vol. 35, No. 7, Jul. 2000.

Koji Fujii et al., A Sub–1V Dual–Threshold Domino Circuit Using Product–of–Sum Logic; ISLPED Aug. 2001.

Mircea R. Stan, Low Threshold CMOS Circuits with Low Standby Current; ISLPED 1998, no month.

James Kao, et al., Transistor Sizing Issue And Tool For Multi–Threshold CMOS Technology; DAC 1977, no month.

Mircea R. Stan, Low–Power CMOS With Subvolt Supply Voltages; IEEE Transactions On Very Large Scale Integration (VLSI) Systems, vol. 9, No. 2, Apr. 2001.

Stephen V. Kosonocky et al., Enhanced Multi–Threshold (MTCMOS) Circuits Using Variable Well Bias, ISLPED Aug. 2001.

Siva Narendra et al., Scaling of Stack Effect and its Application for Leakage Reduction; ISLPED Aug. 2001.

Yibin Ye et al., A New Technique for Standby Leakage Reduction in High–Performance Circuits; Symposium on VLSI Circuits Digest of Technical Papers 1998, no month.

Zhanping Chen et al., Estimation of Standby Leakage Power in CMOS Circuits Considering Accurate Modeling of Transistor Stacks, ISLPED 1998, no month.

Shin'Ichiro Mutoh et al., Design Method of MTCMOS Power Switch for Low–Voltage High–Speed LSIs; ASP–DAC 1999, no month.

Ali Keshavarzi et al., Intrinsic Leakage in Low Power Deep Submicron CMOS ICs; International Test Conference 1997, no month.

Liqiong Wei et al., Design and Optimization of Low Voltage High Performance Dual Threshold CMOS Circuits; Design Automation Conference 1998, no month.

Siva Narendra et al., Impact of Using Adaptive Body Bias to Compensate Die–to–Die Vt Variation on Within–die Vt Variation; ISLPED 1999, no month.

* cited by examiner

LOW-LEAKAGE INTEGRATED CIRCUITS AND DYNAMIC LOGIC CIRCUITS

REFERENCE TO RELATED APPLICATION

This application claims priority based on U.S. Provisional Patent Application No. 60/387,822, filed Jun. 11, 2002, the entirety of which is incorporated herein by reference.

BACKGROUND

The present invention relates to integrated circuits, and, more particularly, to integrated circuits with reduced leakage current.

A current trend in integrated chip technology is to reduce operating power (i.e., supply voltage times supply current) as low as possible. Indeed, as the physical size of integrated circuit components, such as transistors, has been scaled down, so has the supply voltage that powers the integrated circuit. The supply voltage must be scaled as dimensions are scaled to avoid various kinds of field-induced breakdown. To maintain high performance (i.e., switching speed of the transistors) of the reduced-power integrated circuits, process engineers have tended to use transistors having a reduced threshold voltage—i.e., the cutoff voltage level at which point the transistors switch from "on" to "off" and vice versa—to implement the switching logic of the integrated circuit. While lower threshold voltages maintain fast switching speeds of the transistors in the face of ever-decreasing supply voltages, the importance of "leakage" current increases as the threshold voltage becomes increasingly smaller.

For small-geometry integrated circuits—circuits wherein transistors having relatively low threshold voltages comprise the circuit's switching logic—a large component of the leakage current is subthreshold leakage. Subthreshold leakage is current leakage between the source and drain of the transistor when the transistor is "off." For various applications, the leakage current is relatively negligible when the device is in "active mode", but leakage current is less tolerable when the device spends a significant amount of time in "standby mode", in which case the leakage current causes power to be wasted with no useful operation being performed. For example, for applications like cellular telephones and laptop computers, which are in standby mode much of the time, the battery life can be improved by reducing the leakage current when the device is in standby mode.

Subthreshold leakage current is particularly acute in integrated circuits comprised primarily of low threshold transistors because low threshold transistors have relatively low resistance as compared to high threshold transistors when they are in their "off" mode. In contrast, high threshold transistors have relatively high resistance when they are in their "off" mode. While it would be possible to decrease the leakage current of an integrated circuit simply by using transistors having relatively high threshold voltages throughout the switching logic of the circuit, the use of such high threshold transistors would unacceptably limit the switching speeds of the transistors in low voltage circuits. As a result, the overall performance (switching speed) of the integrated circuit would suffer. Therefore, the inventors hereof have identified a need for an improved circuit and method for reducing leakage current in integrated circuits comprised of low threshold voltage transistors.

SUMMARY OF THE INVENTION

An integrated circuit is disclosed that includes one or more blocks of switching logic (comprised of transistors) connected between a power supply and a common node. A control transistor connects the common node to ground. The control transistor has a higher threshold level than the voltage threshold level(s) of the transistors that comprise the switching logic blocks. A bias generator provides a positive bias to the body of the control transistor when the control transistor is "on."

The disclosed integrated circuit results in lower leakage current when the circuit is in "standby" mode. When the circuit is in "standby" mode, the control transistor is "off", and the relatively higher threshold voltage level of the control transistor results in greater resistance and less leakage current through it to ground. On the other hand, when the circuit is in "active" mode, the control transistor is "on", and the performance degradations associated with the relatively higher threshold voltage level of the control transistor are reduced by the applied positive body bias, which reduces the threshold voltage level of the control transistor when the circuit is in "active" mode.

In other aspects of the invention, an improved dynamic logic integrated circuit is disclosed that comprises a first circuit portion having (i) a plurality of low threshold transistors and a high threshold transistor all serially connected between a supply voltage and ground, and (ii) a second circuit portion having a low threshold transistor and a high threshold transistor serially connected between a supply voltage and ground. The second circuit portion generates an output signal in response to a first signal generated by the first circuit portion. A bias generator is connected to the body of at least one of the high threshold transistors, and the bias generator is configured to provide a positive bias to the connected high threshold transistor when the high threshold transistor is on.

These, and other, benefits of the disclosed invention will be readily observable by one skilled in the art in light of the following disclosure.

DETAILED DESCRIPTION OF EMBODIMENTS

Integrated Circuits

Figure 1:
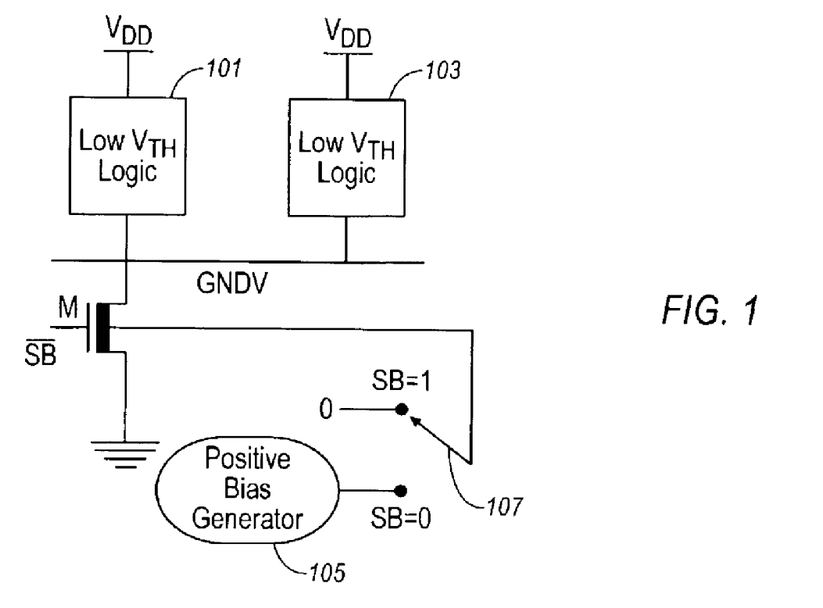
FIG. 1 is a circuit diagram of an integrated circuit according to a first exemplary embodiment of the present invention.

FIG. 1 illustrates a first embodiment of the invention. Generally, the circuitry illustrated in FIG. 1 would be implemented in an integrated circuit, or "chip." A supply voltage, $V_{DD}$ powers the transistors (and any other components) that comprise the integrated circuit. The substantive switching logic of the integrated circuit is contained within and represented by Low $V_{TH}$ Logic elements 101 and 103. The Low $V_{TH}$ Logic is comprised of low threshold voltage transistors, which generally will have threshold voltages below approximately one fourth the level of $V_{DD}$. Each of the Low $V_{TH}$ Logic elements 101 and 103 is connected to a common node, referred to as a common virtual ground, GNDV. The common virtual ground node, GNDV, is connected to ground through control transistor M. Control transistor M is a high threshold transistor, which generally will have a higher threshold level than the low threshold transistors, and which is normally above about one third of $V_{DD}$. The gate of transistor M is connected to "active" control signal $\overline{SB}$. A "high" $\overline{SB}$ signal is indicative that the integrated circuit is to be in "active mode", and a "low" $\overline{SB}$ signal is indicative that the integrated circuit is to be in "standby" mode. When the integrated circuit is in "active" mode, control transistor M is "on", and when the integrated circuit is in "standby" mode, control transistor M is "off."

A switch 107 alternatively connects the body of control transistor M to either a bias generator 105 or ground, depending on the value of control signal SB. The bias generator 105 provides a positive body bias to the body of control transistor M. The switch 107 is controlled by standby control signal SB, which always has the opposite state as $\overline{SB}$. Thus, when $\overline{SB}$ is "high" (circuit is in "active" mode), SB is "low", and when $\overline{SB}$ is "low" (circuit is in "standby" mode), SB is "high." When standby control signal SB is "high" (i.e., the circuit is in "standby" mode), the body of transistor M is connected to ground. Conversely, when the standby control signal SB is "low" (i.e., the integrated circuit is in "active" mode), the body of transistor M is connected to the bias generator 105, which provides a positive bias to the body of control transistor M.

The above-described embodiment of the invention functions as follows. The integrated circuit is powered by supply voltage $V_{DD}$. When in the "active mode" (i.e., $\overline{SB}$ is "high"), the logic circuitry of the integrated chip (shown as block Low $V_{TH}$ Logic elements 101 and 103 in FIG. 1) draws current from the supply voltage $V_{DD}$, and the current flows through the logic circuitry to the virtual ground node, GNDV. Control transistor M is "on" as a result of the "high" $\overline{SB}$ signal, and the current flows from the virtual ground node, GNDV, through control transistor M to ground. Signal SB is "low" (because $\overline{SB}$ is "high"), which causes the switch 107 to connect the bias generator 105 to the body of transistor M. The positive bias applied to the body of control transistor M causes the threshold voltage of transistor M (which is normally relatively high) to decrease, and, thus, reduces the resistance of transistor M. The lower threshold voltage of transistor M (and lower resistance) during the "active mode" of the integrated circuit increases the performance (switching speed) of the integrated circuit relative to the performance of the circuit if transistor M was operated with its normal high threshold voltage (and relatively higher resistance). Further, transistor M can be smaller for a given current-carrying capability, and the noise at the virtual ground node will be smaller for transistors of a given size.

When the integrated circuit is put into "standby mode" ($\overline{SB}$ is "low" and SB is "high"), control transistor M turns "off." Further, the body of transistor M is disconnected from the bias generator 105 and connected instead to ground. As a result, the threshold voltage of transistor M returns to its normal level, which is relatively high. The high threshold transistor has a relatively high resistance in its "off" mode, which significantly limits the current path between the virtual ground node, GNDV, and ground. As a result, transistor M significantly limits the overall leakage current of the integrated circuit while in the "standby" mode.

In effect, control transistor M acts as a "gatekeeper" for all current flow through the switching circuitry (Low $V_{TH}$ Logic elements 101 and 103), and, as such, is in a position to restrict the overall leakage current of the switching circuitry when the circuit is in "standby mode." The normal high threshold voltage (and thus relatively higher resistance) of transistor M significantly limits the overall leakage current of the switching circuitry. On the other hand, when the integrated circuit is in "active mode", it is desirable that the threshold voltage of control transistor M (and thus, the internal resistance) be relatively low so as not to adversely affect the overall performance of the integrated circuit. The positive body bias is provided to transistor M by bias generator 105 to decrease the threshold voltage of transistor M during "active mode" operation, thereby reducing any negative affect that transistor M has on the overall performance (switching speed) of the circuit.

The use of the bias generator 105 to provide a positive body bias to transistor M does not produce any significant overhead to the overall integrated circuit. The bias generator 105 is active during the "active mode" of the integrated circuit, and it is inactive during the "standby mode" of the integrated circuit. So, it consumes very little power in standby mode. It is relatively easy to generate the necessary positive bias because the positive bias is between the power rails, which is in contrast to generating a negative bias using a charge pump.

Figure 2:
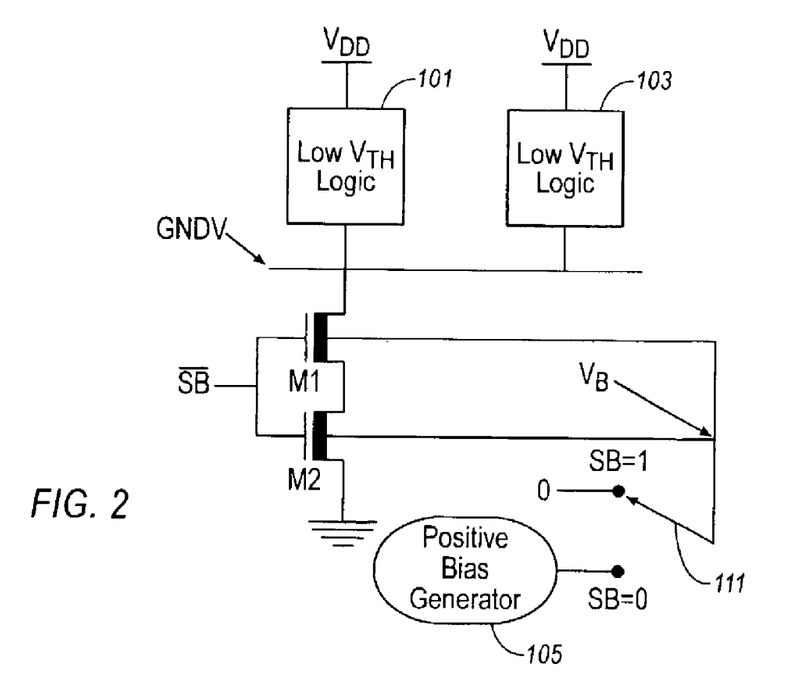
FIG. 2 is a circuit diagram of an integrated circuit according to a second exemplary embodiment of the present invention.

FIG. 2 illustrates a second embodiment of the invention, which essentially comprises an enhancement to the embodiment of the invention illustrated in FIG. 1. Comparing the embodiments of FIGS. 1 and 2, most of the components are identical. The only change is that control transistor M is divided into two transistors M1 and M2. The gates of both transistors M1 and M2 are connected to signal $\overline{SB}$, which is "high" when the integrated circuit is in "active mode" and "low" when the integrated circuit is in "standby mode", in the same fashion as in FIG. 1. By substituting the two transistors M1 and M2 in FIG. 2 in place of the single transistor M in FIG. 1, the overall leakage current of the integrated circuit is reduced even further when the circuit is in "standby mode." When the integrated circuit is in "standby mode", both transistors M1 and M2 are "off." The two "stacked" transistors M1 and M2, as in FIG. 2, have a greater resistance in their "off" mode than a single transistor M, as in FIG. 1. Accordingly, the overall leakage current reduction is improved.

The use of the two "gatekeeper" transistors M1 and M2 does not create any significant detriments to the circuit design as they can both be doubled in size to overcome the speed degradation resulting from stacking the transistors. Since transistors M1 and M2 are not part of the substantive switching logic of the circuit, there is no need to reduce their physical size, as would be necessary if transistors that were part of the switching logic of the circuit were duplicated and "stacked", as described above. Moreover, because the "gatekeeper" transistors M1 and M2 are not part of the switching logic, there is no need to control the inputs of the switching transistors (part of Low $V_{TH}$ Logic blocks 101 and 103) to "low", as would be required if each of the switching transistors were "stacked."

Dynamic Logic Circuits

Figure 3:
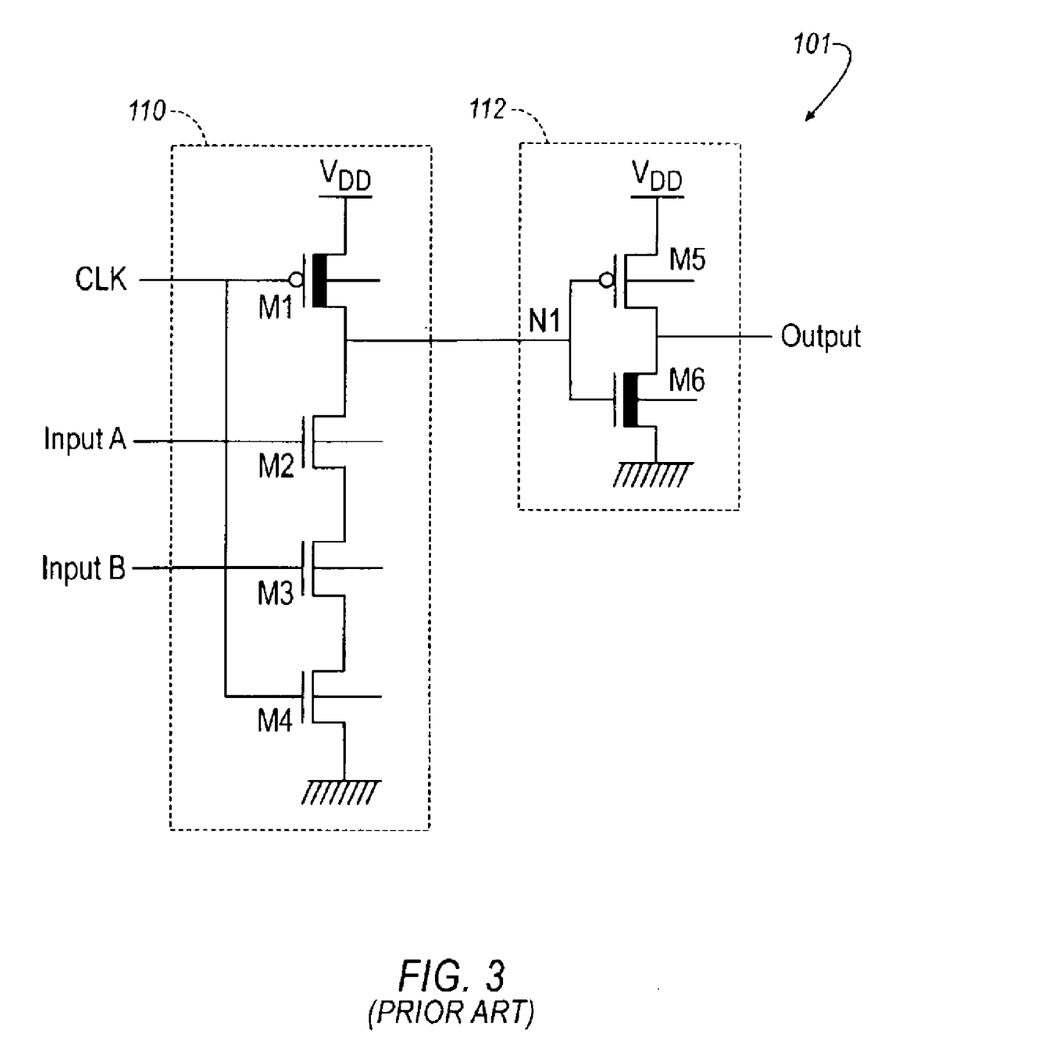
FIG. 3 is an illustration of a known dynamic logic integrated circuit.

Various principles of the disclosed invention can be incorporated into dynamic logic circuits to reduce leakage current through the dynamic logic circuits while in standby mode. FIG. 3 illustrates a known dynamic logic circuit 101, specifically an AND gate. The circuit 101 includes a first circuit portion 110 and a second circuit portion 112. The first circuit portion 110 is comprised of four transistors, M1, M2, M3, and M4, which are serially connected together between the supply voltage $V_{DD}$ and ground, such that M2 is connected downstream of M1; M3 is connected downstream of M2; and M4 is connected downstream of M3. The second circuit portion 112 is comprised of two transistors, M5 and M6, which are serially connected together between the supply voltage $V_{DD}$ and ground. Transistor M6 is connected downstream of transistor M5. Transistors M1 and M5 are PFET transistors (which turn on in response to a low signal applied to their gate), and M2, M3, M4, and M6 are NFET transistors (which turn on in response to a high signal applied to their gate). The gates of transistors M1 and M4 are connected to a clock signal, CLK. The gates of transistors M2 and M3 are connected to input signals A and B to the circuit, respectively. The first circuit portion 110 generates a signal at node N1, which controls the gates of transistors M5 and M6. The ultimate output signal of the dynamic logic circuit 101 is taken from the node between the drain of transistor M5 and the drain of transistor M6.

When the clock signal CLK is low (logical 0), the dynamic logic circuit 101 is in "precharge" mode. In precharge mode, transistor M1 is "on" and M4 is "off." As a result, the N1 node is pulled up to $V_{DD}$ voltage (logical 1), causing transistor M5 to be "off" and M6 to be "on." Consequently, the output of the circuit is pulled low (logical 0) through transistor M6. In the precharge mode, transistors M1 and M6 are primarily responsible for the switching speed of the circuit, and thus are primarily responsible for the performance of the circuit 101 in this mode.

When the clock signal CLK is high (logical 1), the dynamic logic circuit 101 is in "evaluate" mode. In evaluate mode, the high clock signal turns transistor M1 "off" and transistor M4 "on." If both inputs A and B are high (logical 1), then a current flow path exists from node N1 (which was driven high during the pre-charge mode) through transistors M2, M3 and M4, which pulls node N1 low (logical 0). The low value at node N1 turns transistor M5 "on" and transistor M6 "off." With this combination of M5 and M6, the output of the circuit is pulled up to $V_{DD}$ (logical 1). If either of the inputs A or B are low (logical 0), then no current path exists between node N1 and ground. In this case, node N1 remains at a high level, leaving transistor M5 "off" and transistor M6 "on." Thus, the output of the circuit remains low (logical 0). In the evaluate mode, the performance of the circuit is primarily dependent on the switching speeds of transistors M2, M3, M4, and M5.

As shown in FIG. 3, transistors M2, M3, M4, and M5 are low threshold transistors—generally, transistors having a threshold voltage that is less than approximately one fourth the value of $V_{DD}$. Transistors M1 and M6 are high threshold transistors—i.e., generally, transistors that have a threshold voltage that is greater than the threshold voltage of the low threshold transistors in the circuit. High threshold transistors commonly have a threshold voltage level that is greater than approximately one third of $V_{DD}$. High threshold transistors are used for M1 and M6 to better reduce leakage current in the circuit 101 in standby mode. When transistors M1 and M6 are high threshold transistors, the dynamic logic circuit 101 is in "standby" mode when the clock signal CLK is set to high (logical 1) and both inputs A and B are set to high (logical 1). A high clock signal turns transistor M1 "off" and transistor M4 "on." With inputs A and B both high, transistors M2 and M3 are both "on", which pulls node N1 low (logical 0) and thereby turns transistor M6 "off." As a result of this configuration, the only current paths to ground are cut off by transistors M1 and M6, both of which are "off." Moreover, since transistors M1 and M6 are both high threshold transistors, they have a relatively high resistance, thereby restricting leakage current in the "standby" mode. Further, because transistors M1 and M6 do not have a significant affect on the performance of dynamic logic circuit 101 when the circuit is in the critical evaluate mode, their relatively larger resistance does not affect the evaluate mode of the circuit 101. Rather, in the evaluate mode, the performance of the circuit 101 is primarily dependent on the switching speeds of transistors M2, M3, M4 and M5, all of which are low threshold transistors. Thus, the performance of the circuit is not compromised in the evaluate mode.

Though the high threshold levels of transistors M1 and M6 do not have a significant affect on the performance of the circuit in the evaluate mode, the higher resistances associated with transistors M1 and M6 do affect the performance of the circuit in the precharge mode. While less important to the overall performance of the chip, slowing switching speeds of the transistors in the precharge mode still negatively affects the overall circuit performance and is undesirable.

Figure 4:
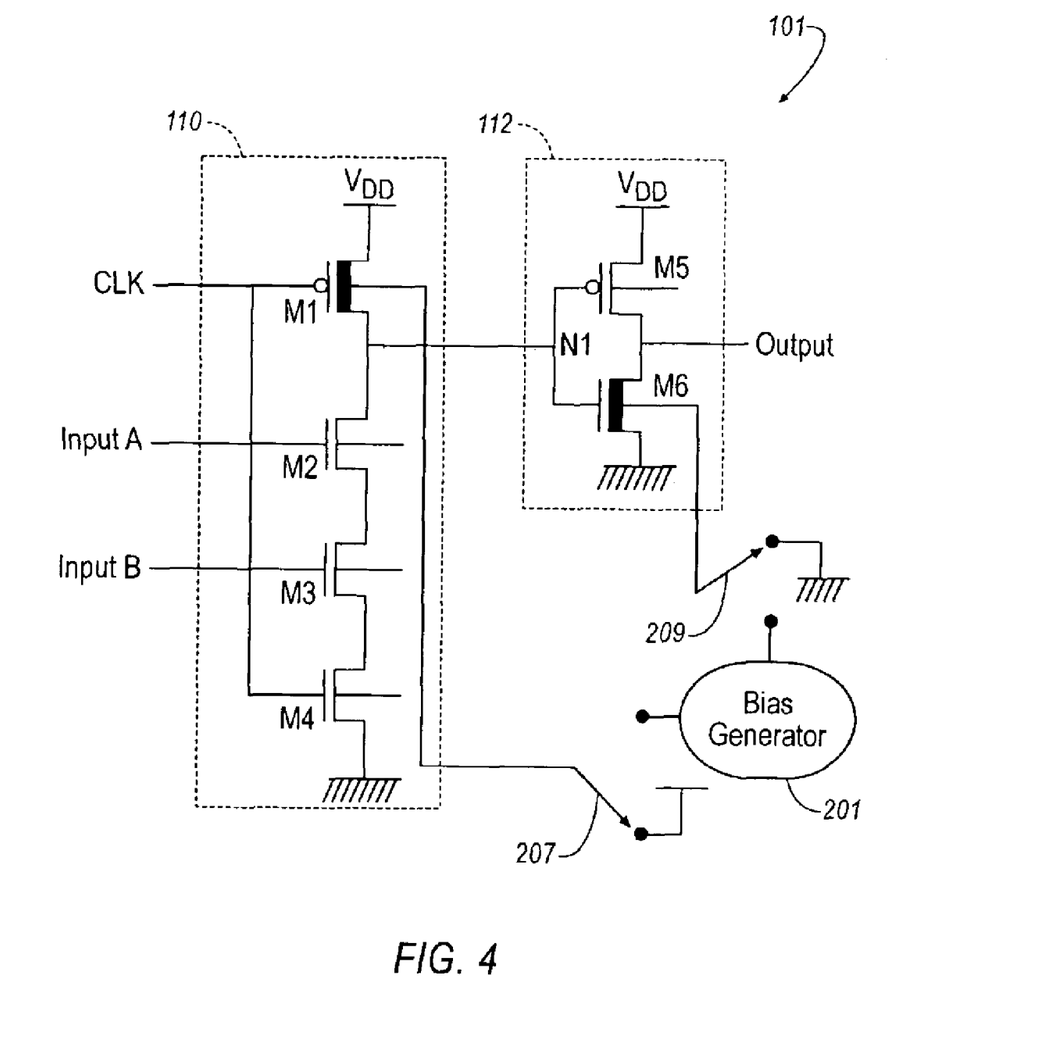
FIG. 4 is an illustration of a first exemplary embodiment of a dynamic logic circuit, according to the present invention.

FIG. 4 illustrates a first embodiment of the invention. As illustrated, this first embodiment includes the basic dynamic logic circuit 101 as illustrated in FIG. 3. Further, this embodiment of the invention includes a bias generator 201 connected to the bodies of high threshold transistors M1 and M6 through switches 207 and 209, respectively. The bias generator is configured to apply a positive bias between 0 and $V_{DD}$ volts to the bodies of transistors M1 and M6 when the circuit 101 is in the precharge and evaluate modes, and to connect the bodies of M1 and M6 to $V_{DD}$ and ground, respectively, when the circuit is in standby mode. The positive body bias applied to the high threshold transistors M1 and M6 reduces their respective threshold levels and thus their resistance during the precharge and evaluate modes. As a result of the lower resistance, the switching speeds of transistors M1 and M6 improve. Because the performance of the integrated circuit during the precharge mode is primarily dependent on the switching speeds of transistors M1 and M6, the circuit performance is improved, particularly during the precharge mode, by applying the positive body bias to transistors M1 and M6. In "standby" mode, the body of high threshold transistor M1 (which is a PFET transistor) is connected to $V_{DD}$ volts and the body of high threshold transistor M6 (which is an NFET transistor) is connected to 0 volts, in each case to maximize the threshold voltage of the respective transistor and to minimize the leakage current. The circuit is shown in standby mode in FIG. 4, as switch 207 is connecting transistor M1 to $V_{DD}$ and switch 209 is connecting transistor M6 to ground. In precharge or evaluate modes, switches 207 and 209 would be connecting the bias generator to the bodies of transistors M1 and M6.

Figure 5:
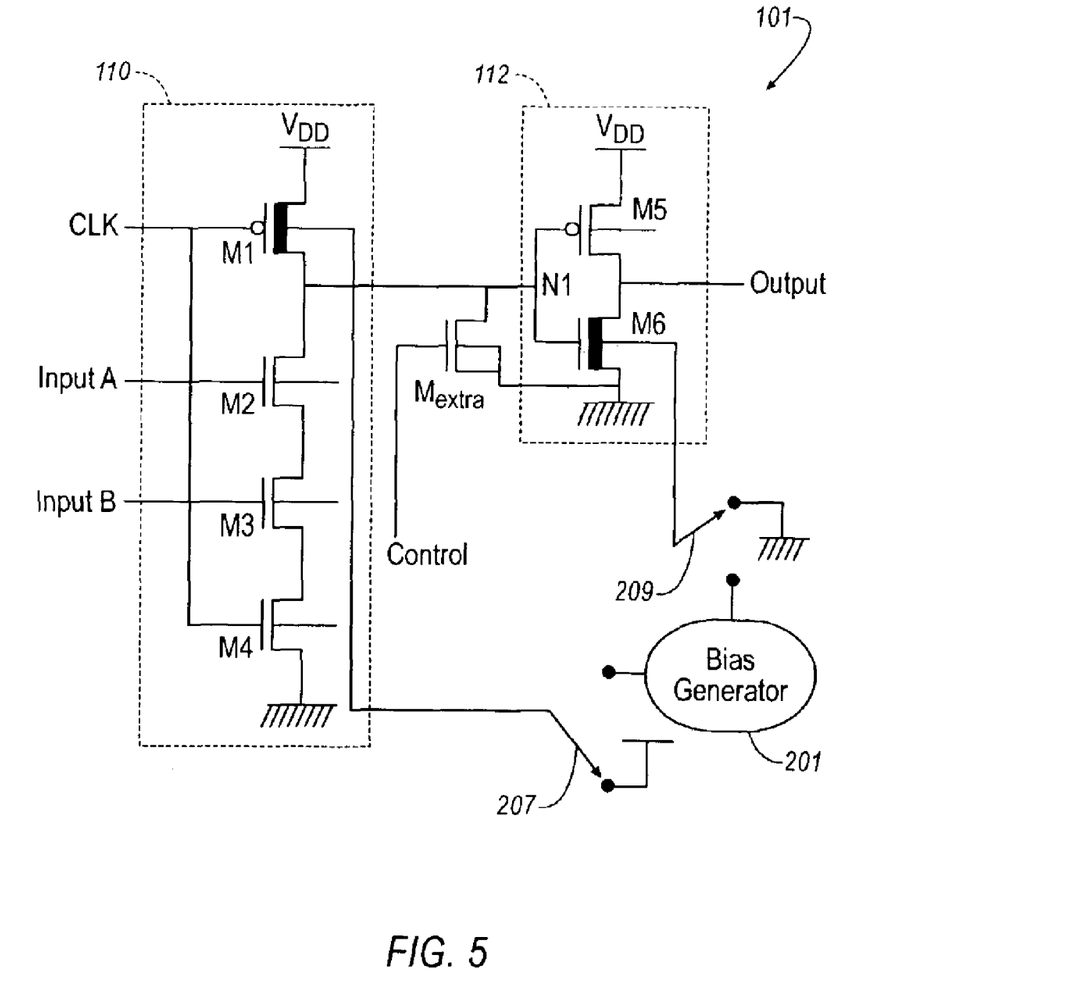
FIG. 5 is an illustration of a second exemplary embodiment of a dynamic logic circuit, according to the present invention.

FIG. 5 illustrates a second embodiment of the present invention. The embodiment in FIG. 5 includes the basic dynamic logic circuit 101 as illustrated in FIG. 3, including low threshold transistors M2, M3, M4, and M5, and high threshold transistors M1 and M6. Further, the embodiment shown in FIG. 5 also includes a bias generator 201 connected to the bodies of transistors M1 and M6, in the same manner as the embodiment illustrated in FIG. 4. In addition, the embodiment of the invention set forth in FIG. 5 further includes transistor $M_{EXTRA}$, having its drain connected to node N1 and its source connected to ground. The gate of transistor $M_{EXTRA}$ is controlled by a control signal, CONTROL. The CONTROL signal is high (logical 1) when the circuit 101 is in standby mode, and it is low (logical 0) when the circuit 101 is in precharge or evaluate mode.

In operation, the embodiment of the invention illustrated in FIG. 5 functions as described in connection with FIG. 4, with the following exceptions. As noted above, in the embodiment of the invention illustrated in FIG. 4, both inputs A and B to the circuit 101 have to be forced to high (logical 1) during the standby mode. This is because a current path must be established between node N1 and ground to pull the voltage level at node N1 down to ground and turn transistor M6 off. In the embodiment of the invention illustrated in FIG. 5, on the other hand, the levels of inputs A and B can either be high or low in the standby mode. Thus, the embodiment of the invention in FIG. 5 does not require other circuitry to force inputs A and B to high (logical 1). This feat is accomplished by transistor $M_{EXTRA}$. When the control signal is high (during standby mode), node N1 is pulled low through transistor $M_{EXTRA}$, since the source of $M_{EXTRA}$ is connected to ground. With node N1 being low, transistor M6 is turned "off" to provide a relatively high resistance in the current path to ground. As a result, the values of inputs A and B are not required to be high (logical 1) in order to pull node N1 low. Thus, the embodiment of the invention illustrated in FIG. 5 eliminates the otherwise necessary circuitry to drive inputs A and B to high when the circuit is in standby mode.

Figure 6:
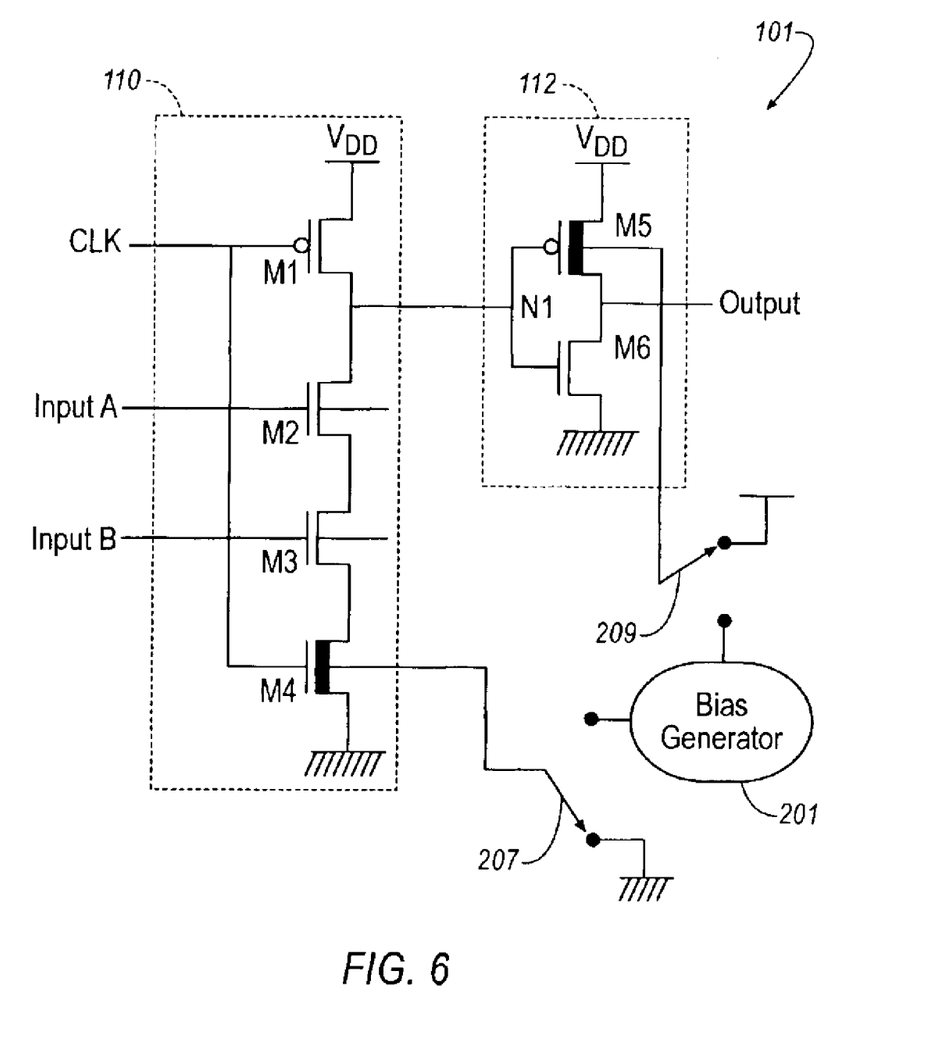
FIG. 6 is an illustration of a third exemplary embodiment of a dynamic logic circuit, according to the present invention.

FIG. 6 illustrates a third embodiment of the invention. The embodiment of the invention set forth in FIG. 6 includes the basic dynamic logic circuit 101 set forth in FIG. 3, except that transistors M1 and M6 are low threshold transistors (instead of a high threshold transistors as in FIG. 3) and transistors M4 and M5 are high threshold transistors (instead of low threshold transistors as in FIG. 3). Further, the embodiment of the invention in FIG. 6 includes a bias generator 201 connected to the bodies of high threshold transistors M4 and M5 through switches 207 and 209.

The operation of circuit 101 is the same as described above in connection with the circuit set forth in FIG. 3, with the following exceptions. When the circuit is in the precharge and evaluate modes, the bias generator provides a positive bias between 0 and $V_{DD}$ volts to the bodies of transistors M4 and M5. The positive body bias reduces the threshold (and thus the resistance) of the transistors M4 and M5, which increases their switching speed and increases the performance of the circuit 101. The positive body bias is particularly important in this embodiment of the invention because transistors M4 and M5 are in the critical path when the circuit is in the evaluate mode, and thus, the performance of the circuit 101 in the evaluate mode is heavily dependent on the switching speeds of transistors M4 and M5. Without the application of the positive body bias to reduce the resistance of transistors M4 and M5, it would be undesirable to use high threshold transistors in the position of transistors M4 and M5, since their relatively slower switching speeds would limit the overall performance of the circuit 101 to an unacceptable level.

When the embodiment of the invention in FIG. 6 is in standby mode, switch 207 connects the body of transistor M4 (which is an NFET transistor) to ground (0 volts), and switch 209 connects the body of transistor M5 (which is a PFET transistor) to $V_{DD}$, again to maximize their respective threshold voltages and thus minimize leakage current. In standby mode, the clock signal is forced to low (logical 0). As described above, when the clock signal is low (logical 0), transistor M4 is off and transistor M5 is off, which together restrict the two possible current paths from $V_{DD}$ to ground. Because the threshold voltages (and resistance levels) of transistors M4 and M5 are relatively high, the leakage current in circuit 101 is significantly limited. Furthermore, in this embodiment of the invention, the values of inputs A and B are not required to have any particular value, which is a benefit over the embodiment of the invention illustrated in FIG. 4. Moreover, this benefit is achieved without the necessity of including an additional transistor, $M_{EXTRA}$, as in the embodiment illustrated in FIG. 5.

Figure 7:
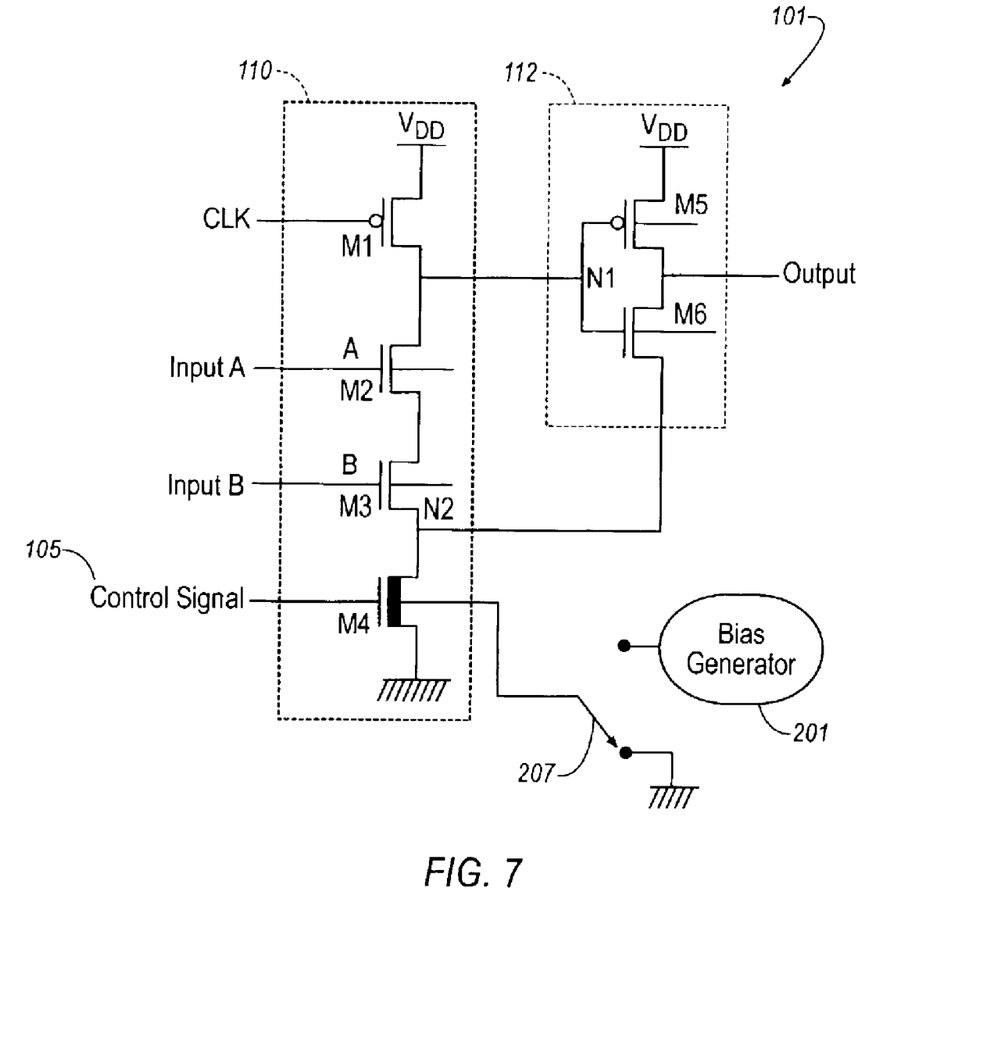
FIG. 7 is an illustration of a fourth exemplary embodiment of a dynamic logic circuit, according to the present invention.

FIG. 7 illustrates a fourth embodiment of the invention. The embodiment of FIG. 7 includes the same basic dynamic logic circuit 101 as the embodiment in FIG. 6, with the following exceptions. The embodiment of the invention in FIG. 7 includes low threshold transistors M1, M2, M3, M5 and M6, and a high threshold transistor M4. Unlike the embodiment in FIG. 6, however, the bias generator 201 is connected only to transistor M4. Further, the gate of transistor M4 is not connected to the clock signal CLK, but, instead, is independently controlled by control signal 105. Finally, the source of transistor M6 is connected to the drain of transistor M4 instead of to ground.

Operationally, the embodiment of the invention in FIG. 7 functions as follows. In this embodiment, transistor M4 is in the critical path when the circuit 101 is in the precharge and the evaluate mode. Accordingly, the switching speed of transistor M4 will significantly affect the performance of circuit 101 in each of the modes. Moreover, since the source of transistors M3 and M6 are both connected to the drain of transistor M4, transistor M4 is in a position in the circuit to act as a "gatekeeper" for any leakage current when the circuit 101 is in standby mode.

As in the embodiments described above, the circuit 101 is in precharge mode when the clock signal CLK is low (logical 0) and independent control signal 105 is forced to high (logical $_1$). Input A or B must be at a logical 0 during precharge. As a result, node N1 is pulled up to high (logical 1), which causes transistor M5 to be off and transistor M6 to be on. Consequently, the output signal of circuit 101 is pulled to the level at node N2, which is low (logical 0) because transistor M4 is turned on (as a result of the control signal 105 being high (logical 1)).

The circuit 101 is in the evaluate mode when the clock signal is high (logical 1) and the control signal 105 is high (logical 1). In this mode, transistor M1 is off and transistor M4 is on. If both inputs A and B are high (logical 1), then both transistors M2 and M3 will be on, thereby providing a current path between node N1 and ground, thus pulling node N1 low (logical 0). As a result of node N1 being low, transistor M5 turns on and transistor M6 turns off, and the output signal is pulled up to $V_{DD}$ (logical 1). If either input A or B is low (logical 0), then the current path between node N1 and ground is cut off, and the voltage level at node N1 remains high (logical 1). As a result, transistor M5 is off and transistor M6 is on. The output signal is pulled down to the level present at node N2, which, because transistor M4 is on, is low (logical 0).

In standby mode, the control signal 105 is forced low (logical 0) to turn transistor M4 off to limit current flow (and power waste). Because any leakage current from circuit 101 would have to pass through transistor M4, transistor M4 is a high threshold transistor. The higher resistance associated with the high threshold transistor M4 improves the ability of M4 to limit the amount of leakage current flowing from circuit 101. However, because transistor M4 is in the critical path in both the precharge and the evaluate modes of the circuit, the higher threshold of transistor M4 would normally degrade the performance of the circuit (due to the slow switching speed of transistor M4) to an unacceptable level. Therefore, according to the present invention, bias generator 201 provides a positive bias to the body of transistor M4 when circuit 101 is in the precharge and evaluate modes, which reduces the threshold voltage of transistor M4 and thereby reduces its resistance. As a result, the switching speed of transistor M4 is improved during the precharge and evaluate modes and the overall performance of the circuit 101 is improved. The bias generator 201 provides a bias of 0 volts to the body of transistor M4 when the circuit 101 is in standby mode. Thus, in standby mode, the transistor M4 has its normal high threshold voltage and relatively higher resistance, which improves its ability to limit the amount of leakage current from the circuit 101. The circuit 101 is shown in standby mode in FIG. 7, as the body of the transistor M4 is connected to ground (0 volts).

While the invention has been described in reference to a particular embodiment thereof, the invention may be embodied in other specific forms without departing from its spirit or essential characteristics. Accordingly, the described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An integrated circuit, comprising:
    one or more blocks of switching logic connected between a power supply and a common node, said switching logic block(s) being comprised of a plurality of transistors having one or more threshold voltage level(s);
    a first control transistor and a second control transistor connected in series between said common node and ground, wherein said first and second control transistors have threshold voltage levels that are greater than said threshold voltages of said switching logic block transistors; and
    a bias generator configured to provide a positive bias to the bodies of each of said first and second control transistors when said control transistors are "on."

2. The integrated circuit of claim 1, wherein said first and second control transistors are configured to be "on" when the integrated circuit is in its "active mode."

3. The integrated circuit of claim 1, wherein said bias generator does not provide a positive bias to the bodies of said first and second control transistors when said control transistors are "off."

4. The integrated circuit of claim 3, wherein said control transistors are configured to be "off" when the integrated circuit is in its "standby mode."

5. The integrated circuit of claim 1, wherein said threshold voltage level(s) of said control transistors is above approximately one third of said voltage source.

6. A method of operating an integrated circuit, comprising:
    providing one or more blocks of switching logic, said switching logic block(s) comprising a plurality of transistors having one or more threshold voltage levels;
    connecting said switching logic blocks to ground through at least two control transistors connected in series, said control transistors having threshold voltage levels that are greater than said threshold voltage level(s) of said switching logic block transistors; and
    providing a positive body bias to said control transistors when said control transistors are "on."

7. The method of claim 6, further comprising the step of configuring said control transistors to be "on" when the integrated circuit is in "active" mode, and configuring said control transistors to be "off" when the integrated circuit is in "standby" mode.

8. An integrated circuit, comprising:
    a first circuit portion having a plurality of low threshold transistors and a high threshold transistor all serially connected between a supply voltage and ground, said first circuit portion generating a first signal;
    a second circuit portion having a low threshold transistor and a high threshold transistor serially connected between a supply voltage and ground, said second circuit generating an output signal in response to said first signal; and
    a bias generator connected to the body of at least one of said high threshold transistors, said bias generator configured to provide a positive bias to said at least one high threshold transistor when said at least one high threshold transistor is on.

9. The integrated circuit of claim 8, wherein the integrated circuit is in standby mode when said at least one high threshold transistor is off.

10. The integrated circuit of claim 9, wherein said bias generator is configured not to provide said positive bias to said at least one high threshold transistor when said at least one high threshold transistor is off.

11. The integrated circuit of claim 8, wherein said bias generator is connected to each of said high threshold transistors in said first and second circuit portions.

12. The integrated circuit of claim 8, further comprising a common transistor serially connected to said first circuit portion and serially connected to said second circuit portion, said common transistor providing a current flow path from said first circuit portion to ground, and further providing a current flow path from said second circuit portion to ground.

13. The integrated circuit of claim 12, wherein said common transistor is a high threshold transistor.

14. The integrated circuit of claim 13, wherein a gate of said common transistor is responsive to a control signal, which is independent of a clock signal.

15. The integrated circuit of claim 8, wherein said bias generator is configured to provide positive body biases to both said high threshold transistor in said first circuit portion and said high threshold transistor in said second circuit portion.

16. The integrated circuit of claim 15, wherein said high threshold transistor in said first circuit portion is responsive to a clock signal.

17. The integrated circuit of claim 15, wherein at least one of said transistors in said first circuit portion has a gate that is responsive to an input signal to the circuit, and wherein said high threshold transistor is connected downstream of said input responsive transistor in a current flow path between said supply voltage and ground.

18. The integrated circuit of claim 17, wherein said second circuit portion includes a high threshold transistor and a low threshold transistor, and wherein a drain of said high threshold transistor is connected to a drain of said low threshold transistor.

19. The integrated circuit of claim 15, wherein at least one of said transistors in said first circuit portion has a gate that is responsive to an input signal to the circuit, and wherein said high threshold transistor is connected upstream of said input responsive transistor in a current flow path between said supply voltage and ground.

20. The integrated circuit of claim 19, wherein said second circuit portion includes a high threshold transistor and a low threshold transistor, and wherein a drain of said low threshold transistor is connected to a drain of said high threshold transistor.

21. The integrated circuit of claim 19, wherein said first signal is present at a first node, and wherein said first node is selectively connected to ground through a switch.

22. The integrated circuit of claim 21, wherein said switch is a transistor.

23. A method of operating an integrated circuit, comprising:
   serially connecting a first plurality of transistors so as to establish a first current path between a supply voltage and ground, wherein at least one of said transistors is a high threshold transistor;
   applying a positive bias to a body of said high threshold transistor when said transistor is on;
   removing said positive bias when said high threshold transistor is off;
   serially connecting a second plurality of transistors so as to establish a second current path between said supply voltage and ground;
   providing a signal from said first plurality of transistors to said second plurality of transistors over a common node, said signal being used to drive gates of said second plurality of transistors; and
   selectively modifying said signal provided from said first plurality of transistors independently of values of input signals to the circuit.

24. An integrated circuit, comprising:
   a first plurality of serially connected transistors establishing a first current path from a supply voltage to ground;
   a second plurality of serially connected transistors establishing a second current path from said supply voltage to ground;
   wherein said first and second plurality of transistors each includes at least one high-threshold transistor; and
   a means for decreasing a resistance level of said high threshold transistors when said high threshold transistors are on.

25. The integrated circuit of claim 24, wherein said means for decreasing a resistance comprises a means for applying a positive body bias to said high threshold transistors.

26. The integrated circuit of claim 24, wherein said first plurality of transistors and said second plurality of transistors are connected such that said first current path and said second current path both flow through a single high threshold transistor.

27. The integrated circuit of claim 24, further comprising a means for selectively turning said second plurality of transistors on and off independent of values of input signals to the circuit.

* * * * *